United States Patent
Lim et al.

(10) Patent No.: US 6,970,113 B1
(45) Date of Patent: Nov. 29, 2005

(54) METHOD FOR GENERATION OF EVEN NUMBERED REDUCED GRAY CODES

(75) Inventors: Ngee Ching Peter Lim, Singapore (SG); Yu Zhou, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 37 days.

(21) Appl. No.: 10/929,528

(22) Filed: Aug. 30, 2004

(51) Int. Cl.[7] .............................................. H03M 7/16
(52) U.S. Cl. ........................................ 341/98; 375/242
(58) Field of Search ........................ 341/98, 7; 360/60, 360/61; 714/805; 375/242

(56) References Cited

U.S. PATENT DOCUMENTS

| | | | | |
|---|---|---|---|---|
| 2,632,058 | A | * | 3/1953 | Gray .......................... 375/242 |
| 4,101,882 | A | * | 7/1978 | Kramer ......................... 341/7 |
| 4,146,873 | A | * | 3/1979 | Yamanaka et al. ........... 714/805 |
| 5,969,895 | A | * | 10/1999 | Ueda et al. .................... 360/61 |
| 6,703,950 | B2 | * | 3/2004 | Yi ................................ 341/97 |

* cited by examiner

Primary Examiner—Peguy Jeanpierre
Assistant Examiner—Joseph Lauture
(74) Attorney, Agent, or Firm—Edward L. Miller

(57) ABSTRACT

A cyclic reduced Gray code in n-many bits having 2k-many entries, for any natural number k, where $2^{(n-1)} < 2k < 2^n$ and n is a positive integer, is found by first constructing a $2^n$-many entry code in n-many bits with a reflected binary technique, and then selecting the last k-many ordered entries in the first half of the full reflected binary code, followed by the first k-many ordered entries in the second half of the full reflected binary code. These ordered 2k-many entries are a shortened cyclic reduced Gray code in n-many bits. Alternatively, the first k-many ordered entries in the first half of the full reflected binary code can be selected, followed by the last k-many ordered entries in the second half of the full reflected binary code. If either the original or reduced Gray code is expressed as a table whose columns are bit positions and whose rows are the code entries, then entire columns can optionally be interchanged at will, either before or after the 2k-many selection, to produce additional different cyclic reduced Gray codes that do not outwardly appear to be 'reflected' ones.

5 Claims, 3 Drawing Sheets

METHOD FOR GENERATION OF EVEN NUMBERED REDUCED GRAY CODES

BACKGROUND OF THE INVENTION

A Gray code is an ordered collection of binary integers, all having the same number of bits, where the collection has the property that only one bit changes as the different integers are visited in the ordering associated with that collection. Although the numeric value of the bits in an entry in the collection can be construed as an arabic binary number, the ordering is generally not produced by adding unity to an entry in the collection to find its successor. In a very real sense a Gray code IS the "contrived" arrangement of a sequence of binary integers into an ordering of the particular type noted above, and there is more than one Gray code. And while programmatically executed algorithmic and logical operations can be used to generate and then operate on Gray codes, and gating implemented in hardware can 'increment' and 'decrement' Gray code counters and also convert between Gray code and true binary, such operations are generally not viewed as being arithmetic in nature.

Gray codes are useful in limiting ambiguity in encoders, in interfaces that communicate across the boundaries of mechanisms controlled by separate clock signals, and also for limiting the generation of noise or of glitches on power supplies and grounds that might be caused by a large number of logic elements changing state at one time (e.g., a transition from 001111 to 010000). It is common in high speed data communication circuitry for the Gray code in use to be implemented in hardware; e.g., counters that count using a particular Gray code and for addressing of finite state machines.

There is a particular Gray code that is often called the 'standard' Gray code; it is a popular instance of a class of codes that are properly called a reflected binary code. A reflected binary code is cyclic, and most have a full $2^n$ different entries for n-many bits. (By 'cyclic' we mean that the 'first' and 'last' entries in the ordering are still just one bit apart, so that the ordering 'wraps around' to start over.) It appears that these reflected binary codes were first described by Frank Gray of Bell Telephone Laboratories in U.S. Pat. No. 2,632,058 entitled PULSE CODE COMMUNICATION, issued 17 Mar. 1953. Subsequently, a fair amount of attention has been focused on Gray codes, 'standard' and otherwise. See, for example: Appendix II in *LOGICAL DESIGN OF DIGITAL COMPUTERS* by Montgomery Phister, Jr. 8th ed. 1966, from John Wiley & Sons; §5.2 (Subsets of Sets) in *Combinatorial Algorithms: Theory and Practice* by Reingold, Nieverglet and Deo, 1977, from Prentice-Hall (ISBN 0-13-152447-X); and §20.2 in *NUMERICAL RECIPES IN C: THE ART OF SCIENTIFIC COMPUTING* (ISBN 0-521-43108-5), 1992, from Cambridge University Press. Gray codes continue to find ever wider applications in a variety of diverse fields, as even a quick perusal of the following web sites will illustrate: http://www.nist.gov/dads/HTML/graycode.html and, http://www.cs.bham.ac.uk/Mirrors/ftp.de.uu.net/EC/clife/www/Q21.htm.

Conventional techniques for discovering or generating a Gray code are limited to codes that have $2^n$-many entries, where n is the number of bits of each integer. This is unfortunate, as there are applications where a Gray code with a fewer number of entries will suffice. However, most of the subsets of a $2^n$ Gray code are not cyclic, a disadvantage that may very well preclude their usefulness. A reliable method for generating cyclic Gray codes having less than $2^n$ entries would save hardware and power consumption for those applications that do not require a full $2^n$ entries. By less than $2^n$ entries we mean, of course, that a full power of two is more entries within an n-bit Gray code than we actually need, and that some number of entries m, where $2^{(n-1)}<m<2^n$, would do just fine. So the question is, "How can we find cyclic Gray codes of n-many bits that have m-many entries?"

SUMMARY OF THE INVENTION

A solution to the problem of finding a cyclic Gray code of n-many bits with less than $2^n$ entries is provided by a disclosed algorithm that allows the generation of a cyclic Gray code in n-many bits having 2k-many entries ("2k Gray codes"), for any natural number k, where $2^{(n-1)}<2k<2^n$ and n is a positive integer. We shall call such Gray codes "reduced" Gray codes. In brief, the method involves the construction of a $2^n$-many entry code in n-many bits with a reflected binary technique, and then selecting the last k-many ordered entries in the first half of the full reflected binary code, followed by the first k-many ordered entries in the second half of the full reflected binary code. These selected ordered 2k-many entries are a shortened, yet still cyclic, (reduced) Gray code in n-many bits. Alternatively, the first k-many ordered entries in the first half of the full reflected binary code can be selected, followed by the last k-many ordered entries in the second half of the full reflected binary code. If a Gray code is represented as a table whose columns are bit positions and whose rows are the code entries, then entire columns can optionally be interchanged at will, either before or after the 2k-many selection, to produce additional different cyclic reduced Gray codes that do not outwardly appear to be 'reflected' ones. Once a cyclic reduced Gray code is identified its gate level circuit realization in hardware (e.g., counter, Gray-binary converter) is readily obtained with a standard synthesis tools such as Synopsys or Simplify that is driven by, say, a description in Verilog of how the entries in the code are related to each other (e.g., sequence, mapping) and to any applied control signals (e.g., increment, decrement).

DESCRIPTION OF A PREFERRED EMBODIMENT

Figure 1:
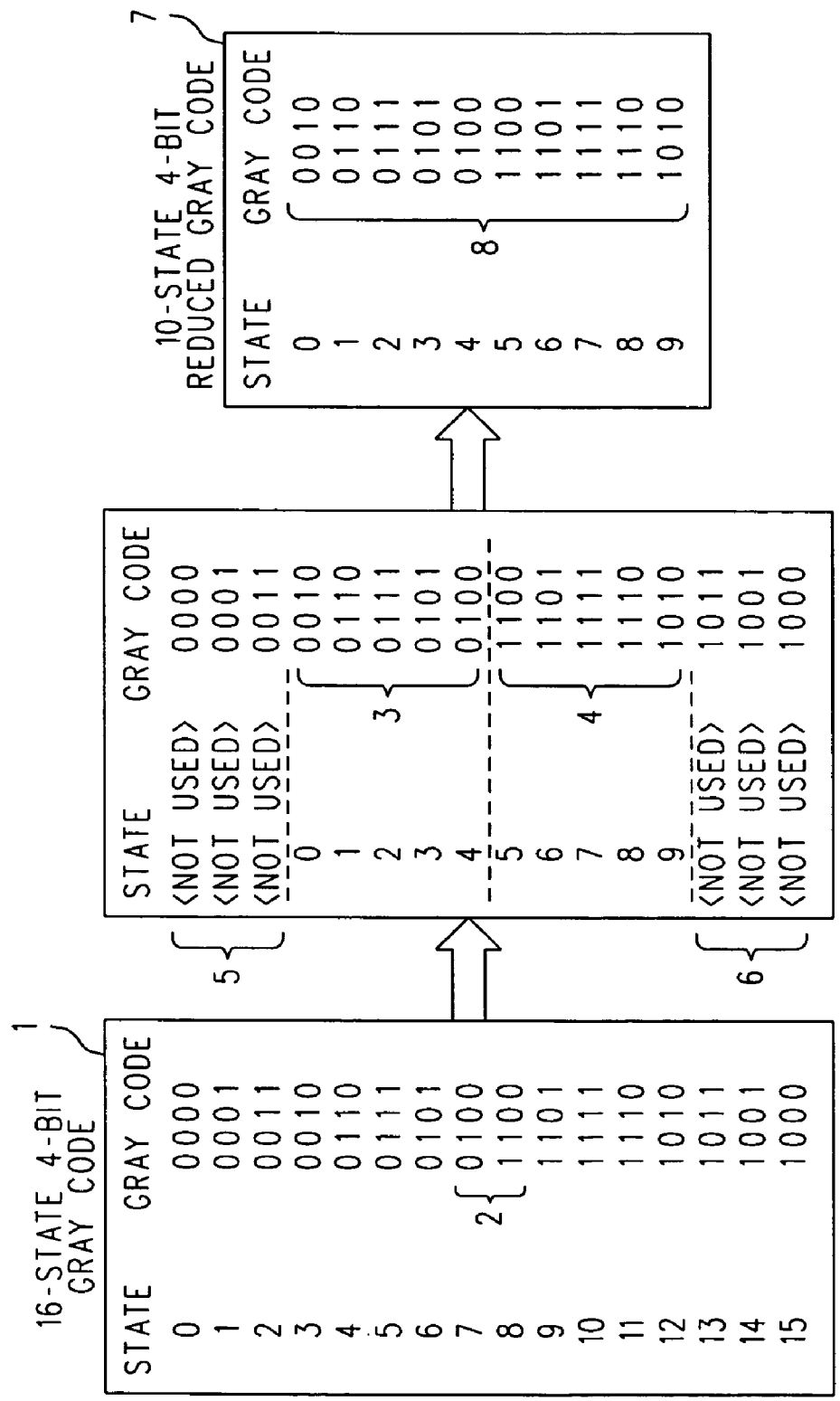
FIG. 1 is an example of the production of a ten-state reduced 2k Gray code in four bits.

Let's begin by considering how a reflected binary Gray code of n-many bits and $2^n$-many states is constructed. Although there are various explanations or recipes, we have robbed the one below from the www.nist.gov web site mentioned earlier.

One way to construct a Gray code in n bits is to start with one for n−1 bits. Let's say we start with a Gray code for two bits (in this example and those that follow, an ordinal state number ($S_i$) is shown to the left of each Gray code entry):

| (a) |   |
|-----|---|
| $S_0$ | 00 |
| $S_1$ | 01 |
| $S_2$ | 11 |
| $S_3$ | 10 |

Now repeat the Gray code for n−1 bits below itself, but in reverse order:

| (b) |   |
|-----|---|
| $S_0$ | 00 |
| $S_1$ | 01 |
| $S_2$ | 11 |
| $S_3$ | 10 |
| $S_4$ | 10 |
| $S_5$ | 11 |
| $S_6$ | 01 |
| $S_7$ | 00 |

Now we append a zero or a one to the left of the first, or top half, and the complement of that to the second, or bottom half:

| (c) OR (d) |   |   |   |
|-----|---|-----|---|
| $S_0$ | 000 | $S_0$ | 100 |
| $S_1$ | 001 | $S_1$ | 101 |
| $S_2$ | 011 | $S_2$ | 111 |
| $S_3$ | 010 | $S_3$ | 110 |
| $S_4$ | 110 | $S_4$ | 010 |
| $S_5$ | 111 | $S_5$ | 011 |
| $S_6$ | 101 | $S_6$ | 001 |
| $S_7$ | 100 | $S_7$ | 000 |

The results are two reflected binary 3-bit Gray codes. Of course, we could have started with a different 2-bit one (00, 10, 11, 01). And, lest the reader mistakenly believe that reflected binary Gray codes are the only Gray codes, here are two non-reflected 3-bit Gray codes:

| (e) AND (f) |   |   |   |
|-----|---|-----|---|
| $S_0$ | 000 | $S_0$ | 000 |
| $S_1$ | 100 | $S_1$ | 001 |
| $S_2$ | 101 | $S_2$ | 101 |
| $S_3$ | 111 | $S_3$ | 100 |
| $S_4$ | 110 | $S_4$ | 110 |
| $S_5$ | 010 | $S_5$ | 111 |
| $S_6$ | 011 | $S_6$ | 011 |
| $S_7$ | 001 | $S_7$ | 010 |

Either (e) or (f) could, however, be used as the starting point for creating a 4-bit reflected binary Gray code. Clearly, there is a large family of Gray codes, and reflected binary Gray codes are simply a subset of that family. (It's not hard to get a non-reflected Gray code from a reflected one—simply interchange the far left column with some other column. That's how we got (f) from (c). The far left and middle columns were interchanged.)

Now, before we proceed further, there are some things that we should point out. The various Gray code examples (a), (c) and (d) that we started with all share a property of interest. Notice how the codes can be placed into paired correspondence about the middle of the ordered collection. That is, $S_1$ with $S_2$ and $S_0$ with $S_3$ for (a), and likewise $S_3/S_4$, $S_2/S_5$, $S_1/S_6$ and $S_0/S_7$ for (c) and (d). The substance of this correspondence is that the code entries involved could precede or succeed each other in a Gray code. That doesn't mean that we can swap one code entry for the other, but it does mean that such a pair can become a "junction" that joins two other segments of a REDUCED Gray code that would remain after other parts were discarded. That is, this property provides a way to shorten a Gray code and keep it cyclic. Let us term this property of paired correspondence about a midpoint "balance" and say that examples (a), (c) and (d) are instances of balanced Gray codes.

Any instance of a practical Gray code will be finite, and just as the axis for a rotating sphere has two poles, the notion of 'balance' ensures that there is a second transition about which the balanced condition can be observed. So, not only is (c) balanced about the midpoint transition $S_3/S_4$, but it is also balanced about $S_7/S_0$. We can say that on either side of such a location of balance there are pairs of codes that form what can be termed a "symmetrically reversed sequence." So, to look ahead briefly to FIG. 1, $S_0/S_{15}$, $S_1/S_{14}$ and $S_2/S_{13}$ in Gray code 1 are a symmetrically reversed sequence, while $S_7/S_8$ and $S_6/S_9$ of Gray code 9 in FIG. 2 is also a symmetrically reversed sequence.

A moment's reflection (we simply can't resist this particular pun!) will convince the reader that any reflected binary Gray code is balanced as described above, and contains symmetrically reversed sequences. This will be so by virtue of the mirror action of repeating a code beneath itself in reverse order. However, we mustn't think that all Gray codes are balanced. In example (e) $S_2/S_5$ cannot be paired as adjacent in a Gray code! Evidently, (e) was not arrived at by reflection, either. However, the 3-bit 8-state Gray code of (e) could still be used as a starting place for the reflected binary code Gray code construction process (a)–(d) to produce a 16-state 4-bit Gray code that is balanced and that contains symmetrically reversed sequences.

Refer now to FIG. 1, wherein is shown a representation of a method of producing a reduced even numbered Gray code having ten states expressed in code entries of four bits each. It begins with a "standard" Gray code 1, which in this instance was (c) used to seed the reflected binary Gray code construction process shown above. It will be noted that the Gray code 1 is, as a reflected code, balanced about its middle, which is the transition 2 between $S_7$ and $S_8$. Since we desire a ten-state reduced Gray code, we select the five states $S_3$–$S_7$ immediately before the transition 2 and the five states $S_8$–$S_{12}$ immediately after the transition 2, for a total of ten: $S_3$–$S_{12}$. This leaves the three initial states 5 $S_1$ –$S_2$ and the three final states 6 $S_{13}$–$S_{15}$ as unused. Since the Gray code 1 is balanced, the union of the selected states 3 and 4 is also a cyclic Gray code. That is, (old) $S_3$ and (old) $S_{12}$ can be adjacent entries in a Gray code. We renumber these ten states as $S_0$ –$S_9$ and take it as the desired reduced Gray code 8, as shown in the 10-State 4-Bit Reduced Gray Code Table (7).

Figure 2:
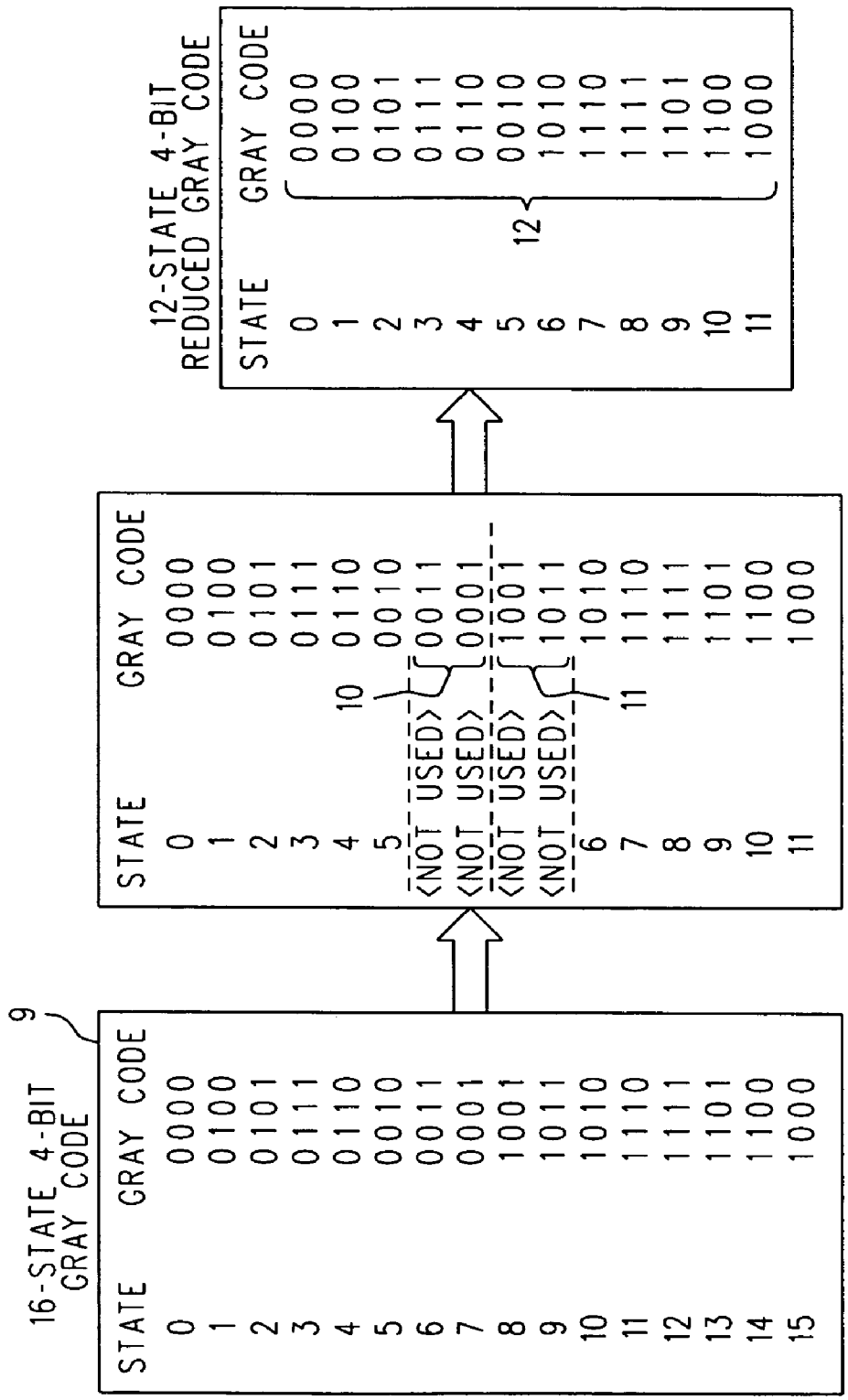
FIG. 2 is an example of the production of a twelve-state reduced Gray code in four bits, but whose columns have also been re-arranged to differ from a reflected binary code.

Refer now to FIG. 2, wherein is shown a further representation of the method of FIG. 1. In this case, we seek a twelve-state reduced Gray code in four bits, and although the same general method is employed, there are some differences. First, the Gray code 9 that is used as a starting point in FIG. 2 is not the same one (1) as used in FIG. 1. It is not the "standard" Gray code that is often used in explanatory examples of introductory text and articles. Instead, it started out as the 3-bit non-reflected Gray code (e) described earlier.

We might also have chosen to start with (f). In any event, the reflected binary code technique was applied to (e) to produce a balanced cyclic Gray code (9) of sixteen states in four bits. To produce twelve-state reduced Gary code we discard four states: the two (10) above the middle ($S_7/S_8$) transition in the original Gray code 9, and the two (11) below it. The result is the twelve-state reduced Gray code 12.

The reader will appreciate that the essential difference between FIG. 1 and FIG. 2 is not so much the number of states in the resulting reduced Gray code, but the locations of the discarded states. Relative to the usual manner of illustrating a code as a table, the different reduced Gray codes are formed by discarding members of a symmetrically reversed sequence about a transition that is a 'point of balance' located in different spots in the (original and un-reduced) table. Since a reflected binary Gray code is cyclic, where the points of balance are in the tabular rendition depends solely on which code entry we choose to be first in the original table. And of course, since the resulting reduced Gray code is cyclic, it has several tabular renditions.

In general, then, to find a reduced Gray code of 2k-many code entries in n-many bits we can start with a Gray code in (n−1)-many bits and produce an associated cyclic reflected binary code of $2^2$ entries. We then symmetrically discard some number q of pairs of code entries that belong to a symmetrically reversed sequence, leaving a cyclic reduced Gray code of 2k-many entries, where $2(q+k)=2^n$.

Figure 3:
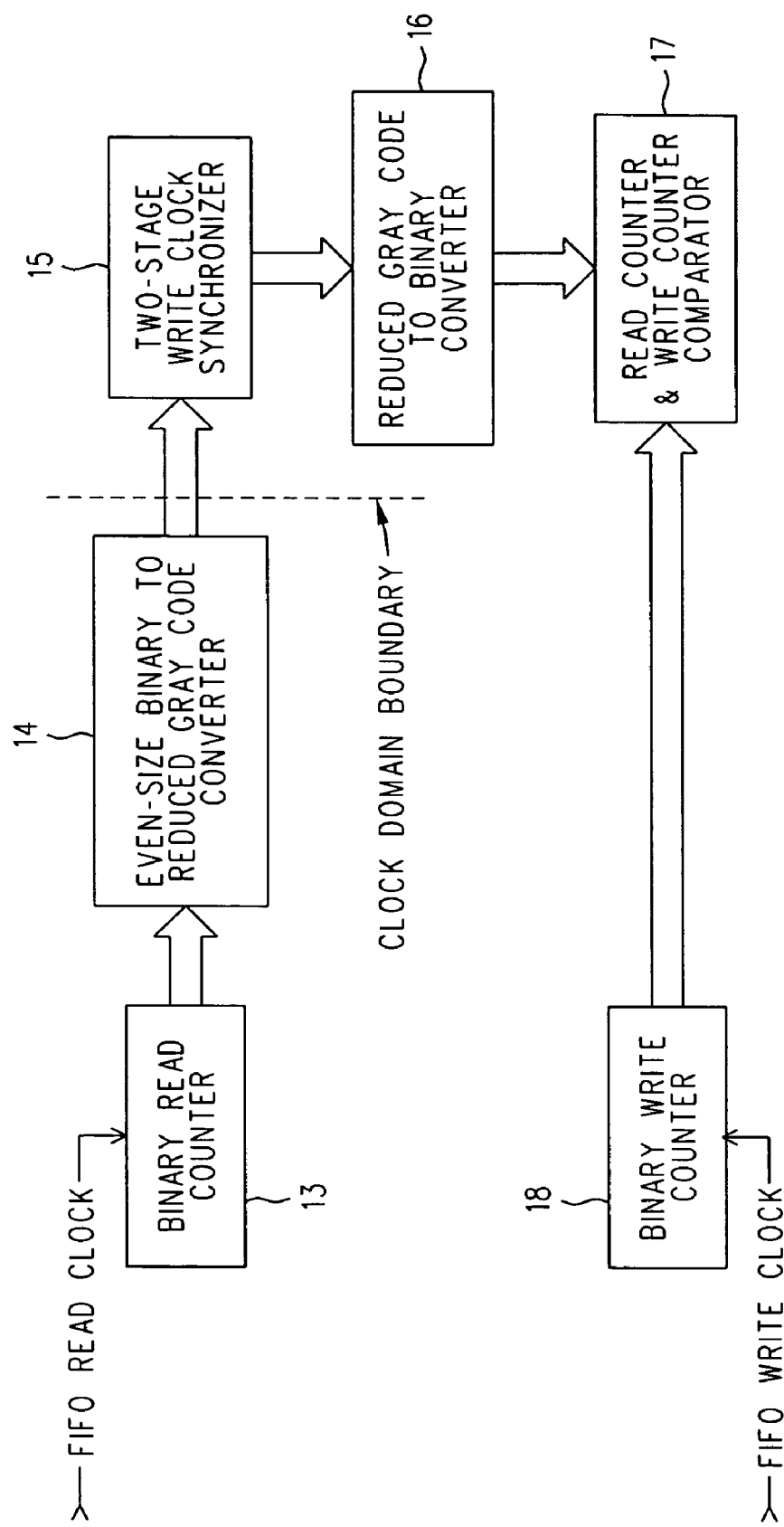
FIG. 3 is a simplified hardware block diagram illustrating how reduced Gray codes can be used in a data communication environment where input and output data are queued and retrieved through FIFO (First In First Out) system.

Finally, refer now to FIG. 3. It is a simplified block diagram of a particular hardware apparatus that incorporates reduced gray codes. An elastic FIFO (First In First Out) is an important element in certain fiber channel data communication arrangements. It connects data of ten-bit width across a clock domain boundary. The FIFO is made up of an arrangement of twelve sets of flip-flops, with each set being large enough to contain one word of data. A twelve-state BINARY WRITE COUNTER (18) is responsive to a FIFO WRITE CLOCK to determine the FIFO location for input data. A twelve-state read counter responsive to a FIFO READ CLOCK determines the FIFO location used for data output. These two counters are compared to each other (17) to generate control signals (not shown) relating to other aspects of operation.

To reduce electrical noise and metastability errors across the clock domain boundary, the BINARY READ COUNT is converted (14) to a twelve-state reduced Gray code, after which it is synchronized (15) with to the FIFO WRITE CLOCK. After synchronization, it is converted back to binary (16) for comparison (17).

It will be appreciated that this same hardware functionality can also be achieved with a related arrangement using counters that count in Gray code to begin with, and dispensing with the conversion between Gray code and binary. However, conversions may be useful if it is deemed easier to implement numerical comparisons in binary, rather than in the Gray code.

We Claim:

1. A method of producing a reduced Gray code in n-many bits of 2k-many entries for a natural number k, the method comprising the steps of:
   (a) reflecting a Gray code in (n−1)-many bits and whose r-many ordered entries are (a, b, c, . . . , i, j) to produce an intermediate cyclic code of 2r-many ordered entries that are (a, b, c, . . . , i, j, j, i, . . . c, b, a), r being greater than k and wherein ( . . . , b, a, a, b, . . . ) and ( . . . , i, j, j, i, . . . ) are entries representing symmetrically reversed sequences in the ordering of the entries;
   (b) appending a first bit value to a selected location in each of the ordered entries (a, b, c, . . . , j) in the first half of the intermediate code to produce entries that are of n-many bits, and appending the complement of the first bit value to the selected location in each of the ordered entries (j, . . . c, b, a) in the second half of the intermediate code to produce entries that are of n-many bits, the combined appended versions of the first and second halves of the intermediate code forming a cyclic reflected binary Gray code of 2r-many entries; and
   (c) symmetrically discarding from the cyclic reflected binary Gray code of 2r-many entries of step (b) 2(r-k)-many consecutive entries corresponding to a symmetrically reversed sequence, leaving a cyclic reduced Gray code of 2k-many entries in n-many bits.

2. A method as in claim 1 wherein the Gray code in (n−1)-many bits of step (a) is itself a reflected binary Gray code.

3. A method as in claim 1 wherein the Gray code in (n−1)-many bits of step (a) is itself a reduced Gray code where 2k is less than $2^{(2-1)}$.

4. A method as in claim 1 wherein 2k is less than $2^{(n)}$ and greater than $2^{(n-1)}$.

5. Apparatus incorporating a Gray code produced in accordance with claim 1.

* * * * *